United States Patent [19]
Hilbert et al.

[11] Patent Number: 4,585,999
[45] Date of Patent: Apr. 29, 1986

[54] RADIOFREQUENCY AMPLIFIER BASED ON A DC SUPERCONDUCTING QUANTUM INTERFERENCE DEVICE

[75] Inventors: Claude Hilbert; John M. Martinis; John Clarke, all of Berkeley, Calif.

[73] Assignee: The United States of America as represented by the United States Department of Energy, Washington, D.C.

[21] Appl. No.: 604,547

[22] Filed: Apr. 27, 1984

[51] Int. Cl.⁴ ............................................. H03F 19/00
[52] U.S. Cl. .................. 330/61 R; 307/306; 324/248; 330/68; 330/250; 357/5
[58] Field of Search ............... 330/60, 61 R, 61 A, 330/62, 63, 68, 250; 307/306; 357/5; 324/248, 318, 322

[56] References Cited

U.S. PATENT DOCUMENTS

| | | | |
|---|---|---|---|
| 3,533,018 | 10/1970 | Jaklevic et al. | 332/52 |
| 3,758,854 | 9/1973 | Zimmerman | 307/306 X |
| 3,978,351 | 8/1976 | Zappe | 307/306 |
| 4,025,844 | 5/1977 | Deutscher | 307/306 X |
| 4,177,476 | 12/1979 | Kroger et al. | 357/5 |
| 4,320,341 | 3/1982 | Lutes | 324/248 |
| 4,324,255 | 4/1982 | Barach et al. | 324/248 X |
| 4,334,158 | 6/1982 | Faris | 307/462 |
| 4,389,612 | 6/1983 | Simmonds et al. | 324/248 |
| 4,403,189 | 9/1983 | Simmonds | 324/248 |
| 4,509,018 | 4/1985 | Gershensun | 307/306 X |

OTHER PUBLICATIONS

Clarke, "Josephson Effect Devices", *Phys. Bull.* Great Britain, vol. 30, 1979, pp. 206–208.
Falco, "SQUIDS: Applications Outside the Laboratory," *Phys. Technol.*, vol. 9, pp. 148–153, 1978.
Clarke et al., "Optimization of dc SQUID Voltmeter and Magnetometer Circuits," *Journal of Low Temperature Physics*, vol. 37, Nos. 3/4, 1979, pp. 405–420.
Ketchen et al., "Ultra-Low-Noise Tunnel Junction dc SQUID with a Tightly Coupled Planar Input Coil," Applied Physics Letters 40(8), Apr. 15, 1982, pp. 736–738.
Martinis et al., "Measurements of Current Noise in dc SQUIDS," LBL-15313, Lawrence Berkeley Laboratory, University of California, May 1983.
Hilbert et al., "Radiofrequency Amplifier Based on a dc Superconducting Quantum Interference Device", *Appl. Phys. Lett.* 43(7), Oct. 1, 1983, pp. 694–696.

Primary Examiner—James B. Mullins
Attorney, Agent, or Firm—Clifton E. Clouse, Jr.; Roger S. Gaither; Judson R. Hightower

[57] ABSTRACT

A low noise radiofrequency amplifier (10), using a dc SQUID (superconducting quantum interference device) as the input amplifying element. The dc SQUID (11) and an input coil (12) are maintained at superconductivity temperatures in a superconducting shield (13), with the input coil (12) inductively coupled to the superconducting ring (17) of the dc SQUID (11). A radiofrequency signal from outside the shield (13) is applied to the input coil (12), and an amplified radiofrequency signal is developed across the dc SQUID ring (17) and transmitted to exteriorly of the shield (13). A power gain of 19.5±0.5 dB has been achieved with a noise temperature of 1.0±0.4 K. at a frequency of 100 MHz.

9 Claims, 7 Drawing Figures

RADIOFREQUENCY AMPLIFIER BASED ON A DC SUPERCONDUCTING QUANTUM INTERFERENCE DEVICE

The U.S. Government has rights in this invention pursuant to Contract No. DE-AC03-76SF00098 between U.S. Department of Energy and the University of California.

BACKGROUND OF THE INVENTION

The present invention relates generally to superconducting quantum interference devices (SQUIDs), and more particularly to an improved, low noise, radiofrequency amplifier using a dc SQUID as the input amplifying element.

Conventional radiofrequency amplifiers operating at room temperature commonly exhibit a substantial amount of internal electronic noise. Such noise, of course, limits the minimum level of input signal that can be detected by the amplifier. The radiofrequency amplifier described herein has a noise level two orders of magnitude below (i.e. 1/100th of) that achieved by a typical room-temperature amplifier operating at frequencies up to 100 MHz.

The radiofrequency amplifier described herein uses a supercooled dc SQUID as the input amplifying element. In order to explain the principle of operation, and to teach the invention, an understanding of a dc SQUID is necessary.

Many metals and alloys become superconducting when they are cooled to a few degrees absolute. It has been theorized that in the superconducting state, electrons with equal and opposite momenta bind together to form "Cooper pairs" with charge $2e$. Each pair has zero net momentum and all pairs in a given superconductor can be described by a single macroscopic wave function with the same quantum-mechanical phase. One demonstration of the existence of the macroscopic wave function is flux-quantization. Suppose a ring is cooled through its superconducting transition temperature in the presence of an axial magnetic field and the field is then removed. A flux, $\Phi$, is trapped in the ring, maintained by persistent supercurrent carried without resistance by the Cooper pairs. However, the flux cannot take an arbitrary value, but is quantized in units of the flux quantum, $$\Phi = h/2e \approx 2 \times 10^{-15} \text{ Wb},$$

where h is Planck's constant and e is the charge on an electron. Thus, $\Phi = n\Phi_o$, where n is an integer.

Josephson tunneling provides a second illustration of the macroscopic quantum state. In 1962, Brian Josephson proposed that Cooper pairs could tunnel through a thin insulating barrier separating two superconductors. Since the tunneling involves electron pairs, rather then single electrons, the current flows through this junction as a supercurrent, and no voltage appears between the two superconductors, i.e. across the insulating barrier. This is the dc Josephson effect. The supercurrent, I, develops a phase difference, $\phi = \phi_1 - \phi_2 =$ between the two superconductors according to the current-phase relation $I = I_o \sin\phi$.

The critical current, $I_o$, the maximum supercurrent the junction can sustain, depends on temperature and the properties of the barrier. If a current greater than $I_o$ is forced through the junction, a voltage, V, will appear across the barrier, and part of the current will flow dissipatively. The Josephson current will persist, but will now oscillate in time at a frequency, $\nu$, wherein $$\nu = d\phi/2\pi dt = 2eV/h = V/\Phi_o.$$

This is the ac Josephson effect. As the current is increased from zero, a voltage jump occurs at $I = I_o$; when the current is reduced, the voltage does not return to zero until the current is almost zero. The hysteresis can be removed by a resistive "shunt"—a strip of normal metal connecting the two superconductors. Part of the current at low voltages in a shunted junction is carried by the ac supercurrent, which has a non-zero time average.

The Superconducting Quantum Interference Device (SQUID) neatly combines flux quantization and Josephson tunneling. SQUIDs come in two varieties, dc and rf, and are by far the most highly developed and widely used Josephson devices.

The dc SQUID consists of two shunted Josephson junctions interrupting a superconducting ring. The constant bias current, $I_B$, (greater than $2I_o$) maintains a non-zero voltage across the SQUID, which has a non-hysteretic current-voltage characteristic. If the magnetic flux, $\Phi$, threading the SQUID ring, is slowly varied, the critical current will oscillate as a function of $\Phi$ with a period that is just $\Phi_o$. The critical current is a maximum for $\Phi = n\Phi_o$, and a minimum for $\Phi = (n+\frac{1}{2})\Phi_o$. The effect of the magnetic field is to change the phase differences between the two junctions. The oscillating behavior arises from interference between the wave functions at the two junctions in a manner analogous to interference in optics—hence the term "Interference Device." At low voltages, the current-voltage characteristic is also modulated because the current contains a contribution from the time-averaged ac supercurrent. As a result, when the SQUID is biased with a constant current, the voltage is periodic in $\Phi$ with period $\Phi_o$.

For several years, dc SQUIDs have been used to measure extremely small values of voltage, magnetic flux and magnetic flux gradients at low frequencies.

An rf SQUID consists of a single, non-hysteretic Josephson junction interrupting a superconducting ring. The rf SQUID is operated by applying a radiofrequency current, at typically 20 or 30 MHz, to an LC-resonant circuit, the inductance of which is coupled to the SQUID. The radiofrequency current thus induces a radiofrequency flux into the SQUID. When the quasi-static flux in the SQUID is changed, the amplitude across the resonant circuit oscillates, again with a period $\phi_o$. The voltage across the resonant circuit is then amplified and detected. An rf SQUID amplifier is restricted to signal frequencies much less than the radiofrequency pump frequency.

SUMMARY OF THE INVENTION

It is an object of the invention to provide an improved broad band radiofrequency amplifier having a very low noise level.

It is a further object of the invention to provide a broad band radio frequency amplifier utilizing a dc SQUID as the input amplifying element.

Additional objects, advantages and novel features of the invention will be set forth in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the present invention, as embodied and broadly described herein, a low noise radiofrequency amplifier is provided, such amplifier having a dc SQUID disposed within a superconducting shield, the dc SQUID having a superconducting ring and two shunted Josephson junctions interrupting the ring, an input coil disposed within the shield and inductively coupled to the SQUID ring, a shielded input cable extending from outside the superconducting shield to the input coil and a shielded output cable extending from across the SQUID ring to the outside of the superconducting shield.

BRIEF DESCRIPTION OF THE DRAWINGS

The accompanying drawings, which are incorporated in and form a part of the invention and, together with the description, serve to explain the principles of the invention.

DESCRIPTION OF THE PREFERRED EMBODIMENT

Figure 1:
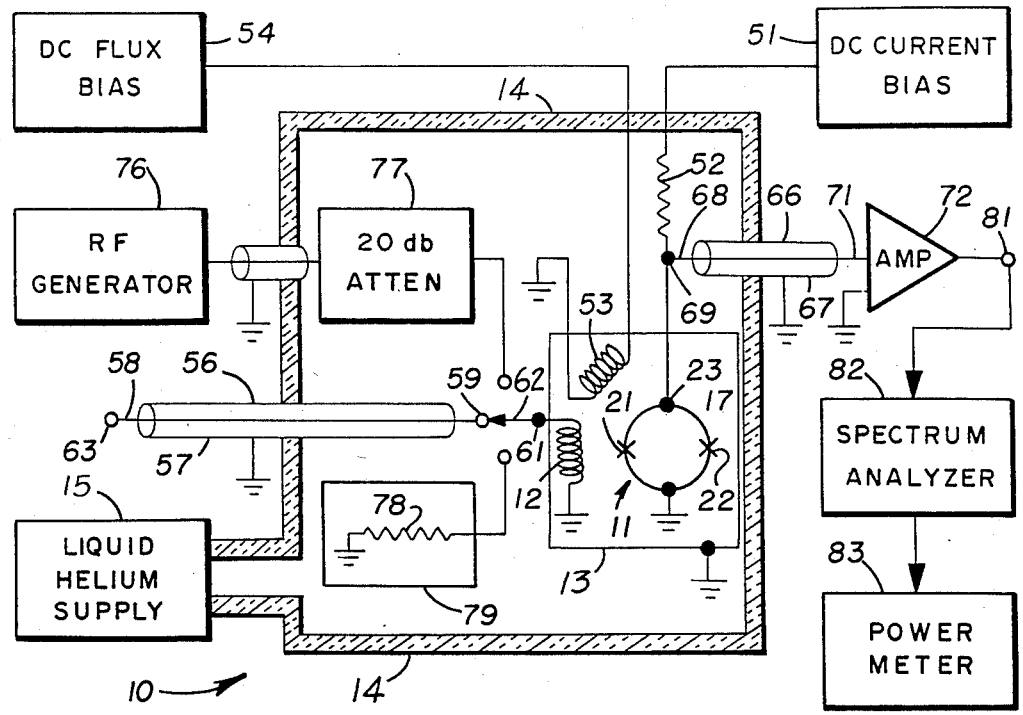
FIG. 1 is a block and schematic diagram of a low noise radiofrequency amplifier made in accordance with the invention.

Referring now to the drawings, which illustrate a preferred embodiment of the invention, the low noise radiofrequency amplifier 10 of the present invention utilizes a symmetrically biased dc SQUID 11 and a closely coupled input coil 12, both disposed within a superconducting shield 13. In turn, these elements are within a thermally insulated container 14 maintained at a superconductivity temperature, as by liquid helium from supply tank 15.

Figure 2:
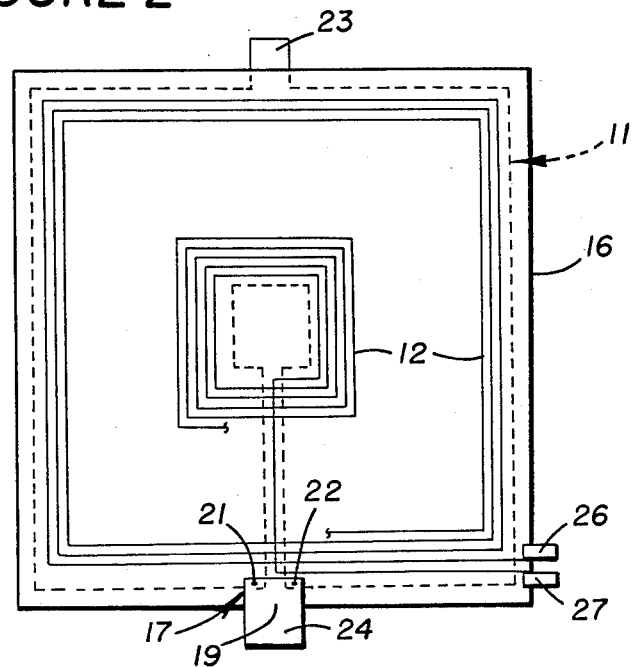
FIG. 2 is a simplified and diagramatic illustration of a dc SQUID usable in the amplifier of FIG. 1.

FIG. 2 illustrates generally the configuration of a dc SQUID 11 and input coil 12 which has been used in the amplifier 10 of the present invention. The dc SQUID 11 and input coil 12 are both formed in a chip 16, with the dc SQUID 11 having a planar configuration with a thin-film superconducting ring 17. The superconducting ring 17 is comprised of a C-shaped conductor 18 (shown in dotted line in FIG. 2) and a conductor 19 which is connected to the conductor 18 by two Josephson junctions 21 and 22. The C-shaped conductor 18 has a portion 23 extending from chip 16 to serve as a bias current input terminal at one side of the ring 17 between the Josephson junctions 21 and 22. Similarly conductor 19 has a portion 24 extending from chip 16 to serve as a bias current output from the outer side of the ring between the junctions 21 and 22.

The input coil 12 (shown in solid lines in FIG. 2) is also of planar configuration and in the form of a spiral ring in close parallel relation to the superconducting ring 17 of the dc SQUID 11. Terminals 26 and 27, from each end of input coil 12, extend to the exterior of chip 16.

Figure 3:
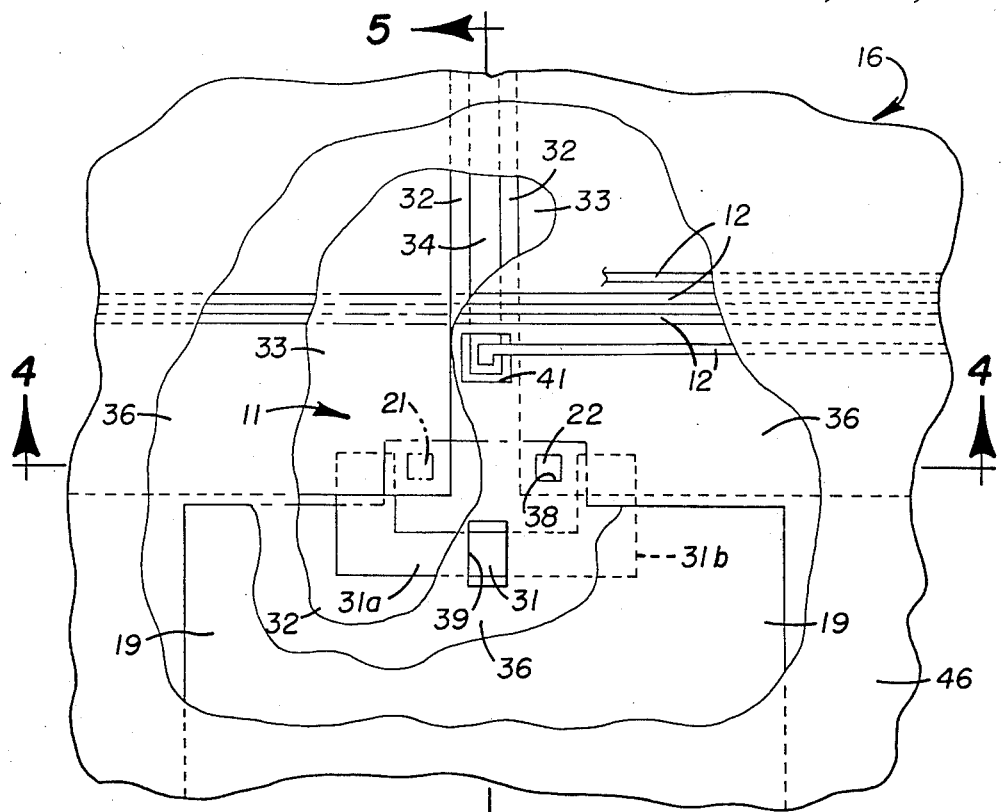
FIG. 3 is an enlarged view of the Josephson junction area of the dc SQUID of FIG. 2.
Figure 4:
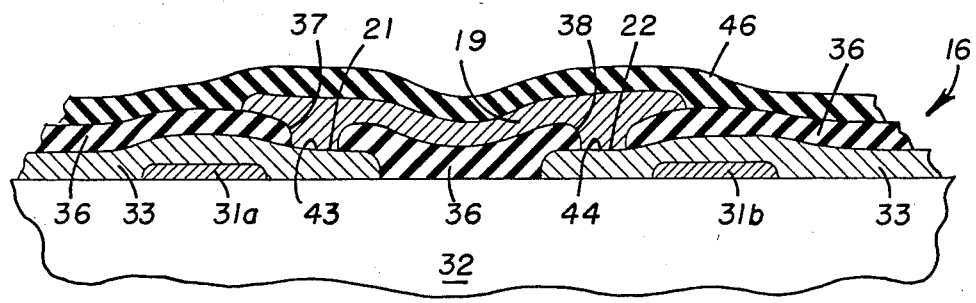
FIG. 4 and 5 are sectional views of the dc SQUID, taken on lines 4—4 and 5—5 of FIG. 3.
Figure 5:
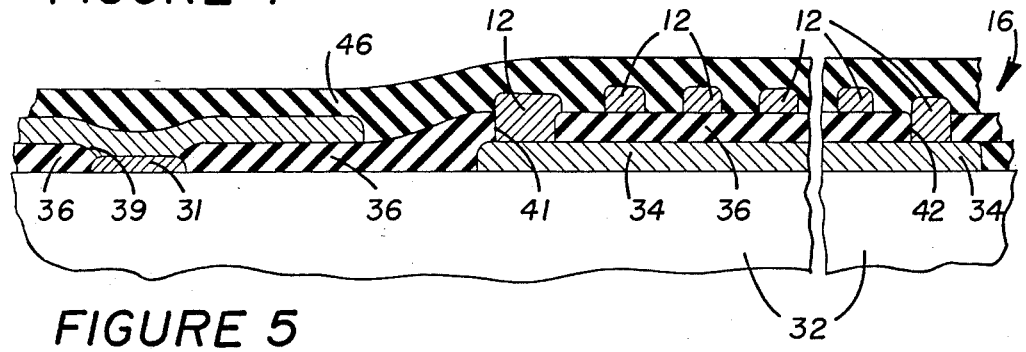

In more particular, the chips 16 of FIG. 2 were fabricated in batches of nine on oxidized silicon substrate wafers. As best seen in FIGS. 3-5, a 30 nm-thick gold-copper (75-25 wt %) film 31 was deposited on the substrate 32, the film 31 being patterned to produce the two resistive shunts 31a and 31b for each SQUID. Next, a 100 nm-thick niobium film 33 was sputtered on and etched to form the C-shaped conductor 18 of the SQUID ring 17, and a strip 34 which is to provide a connection to the inner end of the spiral input coil 12. The third film 36 was a 200 nm-layer of silicon oxide, with two $\mu$m-windows 37 and 38, a larger window 39 to give access to the shunt 31, and two 2$\mu$m-windows 41 and 42, one at each end of the niobium strip 34, to provide connections to the spiral coil 12.

Next, a 300 nm-thick niobium film was sputtered on, and etched to form the 20-turn spiral coil 12. At this point, the wafer was diced to produce nine chips, each with a single device, and the remaining steps were carried out on individual SQUIDs.

Each device was ion-milled to clean the areas of the niobum C-shaped conductor 33 exposed through windows 37 and 38 and the gold-copper shunt 31 exposed through window 39. The exposed niobium was then oxidized with an rf discharge in an argon (5 vol %O$_2$) atmosphere to provide the oxidized surfaces 43 and 44 for the Josephson junctions 21 and 22. The 300 nm-thick lead-indium (95-5 wt %) counter-electrode conductor 19, 24 was deposited and lifted off, thereby completing the junctions and making the common contact with the shunt 31. Finally, a 200 nm-thick passivation layer 46 of silicon oxide was deposited.

Typical parameters of devices thus produced are: SQUID inductance L$\approx$400 pH, critical current per junction I$_o$$\approx$5$\mu$A, capacitance per junction C$\approx$0.5 pF, shunt resistance per junction R$\approx$7 ohms, inductance of input coil L$_i$$\approx$0.12 $\mu$H, coupling coefficient $\alpha^2$=0.75, M$_i$=(LL$_i$)$^{\frac{1}{2}}$$\approx$6 nH, $\beta$≡2LI$_o$/$\Phi_o$$\approx$2 and $\beta_c$≡2$\pi$R$^2$I$_o$C/$\Phi_o$$\approx$0.4.

FIG. 1 illustrates the manner in which the dc SQUID is used in a radiofrequency amplifier. As previously mentioned, the SQUID 11 and the input coil 12 are disposed in a superconducting shield 13 (preferably made of niobium) and maintained at a superconducting temperature. A dc current bias source 51, exteriorly of the shield 13, is connected through resistor 52 to the bias current input 23 of the SQUID ring. In operation as a radiofrequency amplifier, the dc SQUID is operated with a bias current greater than its critical current, thus maintaining a non-zero voltage across each Josephson junction. A flux coil 53 within the superconducting shield 13 is supplied with constant dc current from the dc flux bias source 54 to establish a constant magnetic flux threading the SQUID ring 17.

An input cable 56 having a grounded shield 57 and a shielded signal conductor lead 58 is provided, the signal conductor 58 having one end 59 connected to the signal input end 61 of input coil 12, as through switch 62, and the other end 63 accessible exteriorly of the shield 13 so that a radiofrequency signal outside of the shield may be applied to the SQUID.

An output cable 66 having a grounded shield 67 and a shielded signal conductor lead 68 is provided, the signal conductor 68 having one end 69 connected to the dc current bias input 23 of the SQUID, and its other end 71 connected to the input of a room-temperature radiofrequency amplifier 72 located exteriorly of shield 13.

FIG. 1 also shows the methods used to measure the gain and noise temperature of the dc SQUID used as a radiofrequency amplifier. In measuring the gain, a calibrated signal from a low-noise room-temperature radiofrequency generator 76 was injected into the SQUID input coil 12 via a 20 dB attenuator 77 and switch 62. The attenuator 77, located within the insulated container 14, reduced the room temperature noise to an acceptable level and presented a cold 50 ohm impedance to the input coil 12. The power level at the SQUID input was typically $10^{-15}$ W. Since the dynamic resistance, $R_D$, of the SQUID varied between 8 and 12 ohms, and the room-temperature amplifier 72 had a 50 ohm input impedance, only 45% to 65% of the available signal power from the SQUID was coupled into the amplifier 72.

To measure the noise temperature of the amplifier, a 50 ohm resistor 78 was connected to the input terminal 61 of input coil 12. The resistor 78 was enclosed in a vacuum can 79, and its temperature could be raised to a value $T_i$ by means of a heater (not shown), the magnitude of the temperature $T_i$ being measured by a carbon resistance thermometer. The temperature calibration was verified in a separate experiment in which the Johnson noise was measured at about 100 Hz. In measurements of both gain and noise temperature, the bias current of the SQUID and the applied flux was adjusted to maximize the gain. The bias voltage, V, was typically 20 μV, corresponding to a Josephson frequency of about 10 GHz.

Also, in the measurements of gain and noise, the output 81 of the room-temperature amplifier 72 was coupled to a spectrum analyzer 82 which was also used as a tunable mixer and narrow bandpass filter. The power measurements were made by means of a power meter 83 connected to the output of the spectrum analyzer 82.

Figure 6:
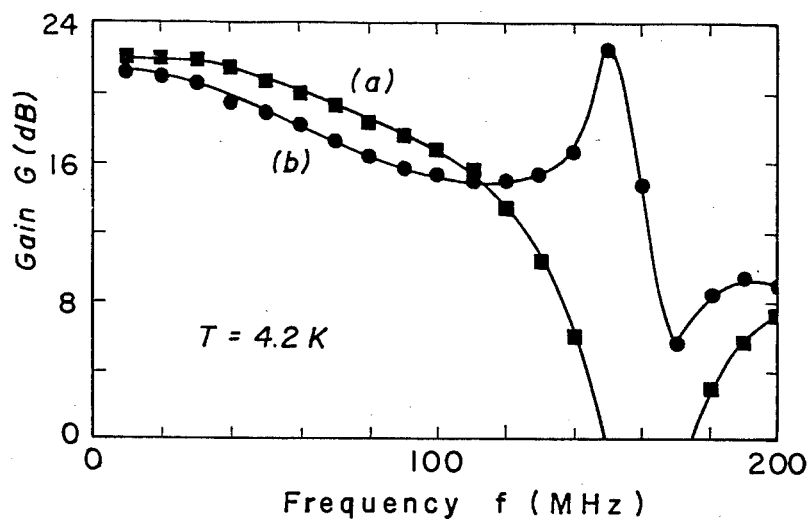
FIG. 6 is a graph of gain versus frequency for an amplifier made in accordance with the invention.

FIG. 6 shows the power gain (G) vs. frequency for a typical SQUID amplifier at 4.20 K. The impedance mismatch between the SQUID and the room temperature amplifier 72 introduces a loss of about 3 dB. Curves (a) and (b) were obtained with dc flux biases of $\Phi=(n\pm\frac{1}{4})\Phi_o$, for which the values of the flux-to-voltage transfer function $\delta V/\delta\Phi \equiv V_\Phi$, were approximately equal in magnitude but opposite in sign. The gain drops by about 5 dB as the frequency increases from about 10 MHz to 100 MHz, due to the increasing impedance of the inductive input. At about 160 MHz, there is a resonance that most likely is due to parasitic capacitance between the SQUID and the input coil. Depending on the sign of $V_\Phi$, the resonance produces either a peak or a dip in the gain, suggesting that the effect is due to feedback from the SQUID to the input coil. Above this resonance, the gain stays roughly constant up to about 500 MHz, with a discernible response at frequencies of over 1 GHz. When the SQUID was operated at 1.50 K, the gain below the resonance increased by roughly 3 dB because of the increase in $V_\Phi$ due to reduced noise rounding of the current-voltage characteristic. At both temperatures, the dynamic range was at least $10^8$ per unit bandwidth.

Figure 7:
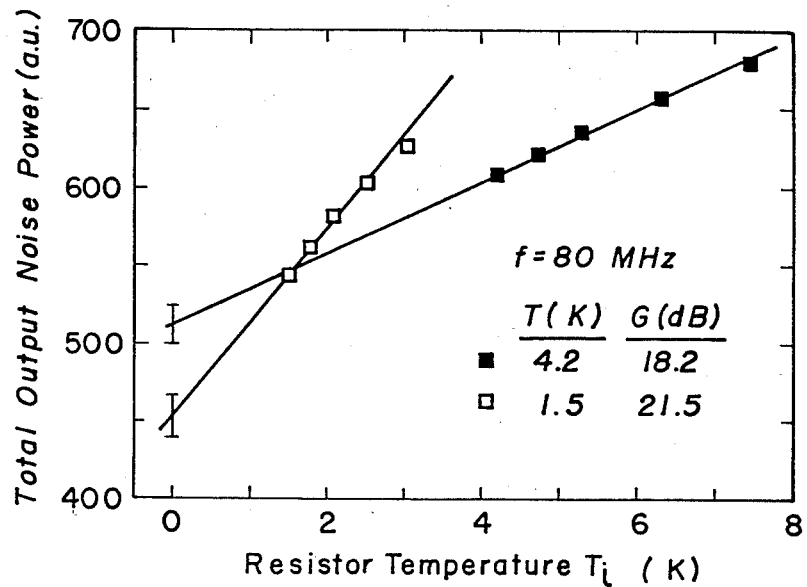
FIG. 7 is a graph of total output noise power versus resistor temperature for an amplifier made in accordance with the invention.

FIG. 7 shows shows the noise temperature of the amplifier. The total noise temperature of the system, $T_N^{TOT}$, referred to the input is $$T_N^{TOT}=T_N+T_i+T_N^A(R_D)/G,$$

where $T_N$ is the SQUID noise temperature, $T_N^A$ is the noise temperature of the room temperature amplifier 72, which depends on $R_D$, and G is the power gain of the SQUID amplifier. The value $T_N^A(R_D)$ was measured by replacing the SQUID with a cold resistor $R_D$. The contribution of the 50 ohm input resistance was determined by plotting the total output noise power vs. $T_i$, as shown in FIG. 7. The slope of the plot calibrates the total system gain. As will be noticed, the gain is higher at the lower operating temperature. The extrapolation of the lines through the data in FIG. 7 to $T_i=0$ yields the sum of the SQUID and amplifier noise temperatures from which the latter can be subtracted out.

The values of G and $T_N$ obtained at 3 frequencies and two operating temperatures are shown below in Table I. At each frequency, as the temperature was lowered from 4.2 K to 1.5 K the gain increased by roughly 3 dB, while the noise temperature was reduced by a factor somewhat greater than the ratio of the bath temperatures, presumably because of the associated increase in gain.

TABLE I

| Gain, G, and Noise Temperature, $T_N$, for a typical dc SQUID | | | | |
|---|---|---|---|---|
| Frequency | T = 4.2K | | T = 1.5K | |
| (MHz) | G(dB) | $T_N$(K) | G(dB) | $T_N$(K) |
| 60 | 20.0 ± 0.5 | 4.5 ± 0.6 | 24.0 ± 0.5 | 1.2 ± 0.3 |
| 80 | 18.0 ± 0.5 | 4.1 ± 0.7 | 21.5 ± 0.5 | 0.9 ± 0.3 |
| 100 | 16.5 ± 0.5 | 3.8 ± 0.9 | 19.5 ± 0.5 | 1.0 ± 0.4 |

As is apparent, a dc SQUID can be operated as a low-noise radiofrequency amplifier with a gain of typically 20 dB, and with a noise temperature of approximately 1 K over a frequency range of 60 to 100 MHz with an operating temperature of 1.5 K. This noise temperature is two orders of magnitude below that achieved at these frequencies with a typical amplifier operating at room temperature.

In FIG. 1, the input coil 12 is shown as being connectable by switch 62 to the input cable 56, or attenuator 77 on resistor 78, for purposes of explanation of the gain and noise measurements. In actual practice, the attenuator 77, resistor 78 and switch 62 would not be included in an amplifier, and the conductor lead 58 of the input cable 56 would be connected directly to the signal input end 61 of the input coil 12.

A radiofrequency amplifier as described herein would have particular use in nuclear magnetic resonance (NMR) imaging systems, wherein very low level radiofrequency signals are generated by resonating hydrogen nuclei in a tissue specimen. For hydrogen nuclei in a field of one tesla, the resonance frequency is 42.57 MHz. Since the intensity of the emitted signal is proportional to the number of resonant nuclei in the specimen, it is desirable that the detecting amplifier has as low a noise level as possible so that the signals from very small volumes of the specimen may be handled.

The foregoing description of a preferred embodiment has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although the amplifier has use in NMR imaging systems, it can be used in other applications wherein very low level radiofrequency signals must be detected. It is intended that the scope of the invention be defined by the claims appended hereto.

We claim:

1. A low noise radiofrequency amplifier comprising;

a superconducting shield, a dc SQUID disposed within said superconducting shield, said dc SQUID having a superconducting ring and two shunted Josephson junctions interrupting said ring, said ring having a bias current input at one side thereof between said junctions and a grounded bias current output at the other side thereof between said junctions, a bias current source disposed exteriorly of said superconducting shield, means for establishing a constant magnetic flux threading said SQUID ring, means connecting said bias current source to said bias current input of said SQUID, an input coil disposed within said superconducting shield, said input coil being inductively coupled to said SQUID ring and having a signal input end and a grounded end, an input cable having a grounded shield and a shielded signal conductor, said signal conductor having one end thereof connected to said signal input end of said input coil and having its other end accessible exteriorly of said superconducting shield, an output cable having a grounded shield and a shielded signal conductor, said signal conductor having one end thereof connected to said bias current input of said SQUID ring and having its other end accessible exteriorly of said superconducting shield.

2. A low noise radiofrequency amplifier as set forth in claim 1 and further including:

a room-temperature radiofrequency amplifier disposed exteriorly of said superconducting shield, said room-temperature radiofrequency amplifier having an output terminal and having an input terminal connected to said signal conductor of said output cable.

3. A low noise radiofrequency amplifier as set forth in claim 1, wherein said dc SQUID is of planar configuration with a thin-film superconducting ring deposited on a substrate.

4. A low noise radiofrequency amplifier as set forth in claim 3, wherein said input coil is of spiral configuration deposited in close parallel relation to said thin-film superconducting ring.

5. A low noise radiofrequency amplifier as set forth in claim 4, and further including:

a room-temperature radiofrequency amplifier disposed exteriorly of said superconducting shield, said room-temperature radiofrequency amplifier having an output terminal and having an input terminal connected to said signal conductor of said output cable.

6. A method of amplifying a radiofrequency signal comprising:

disposing a single symmetrically biased dc SQUID and an input coil within a superconducting shield, said dc SQUID having a superconducting ring interrupted by two shunted Josephson junctions, and said input coil being inductively coupled solely to said ring of said single SQUID, establishing a constant magnetic flux threading said SQUID ring, applying said radiofrequency signal to said input coil from outside of said superconducting shield, obtaining an amplified radiofrequency signal solely from across said ring of said single SQUID, transmitting said amplified radiofrequency signal from across said SQUID ring to the outside of said superconducting shield.

7. A method of amplifying a radiofrequency signal as set forth in claim 6, and further including:

applying said amplified radiofrequency signal from across said SQUID ring to the input of a radiofrequency amplifier located exteriorly of said superconducting shield.

8. The method of amplifying a radiofrequency signal as set forth in claim 6 and further including operating said dc SQUID with a bias current greater than its critical current to maintain a non-zero voltage across each Josephson junction.

9. A method of amplifying a radiofrequency signal as set forth in claim 8 and further including:

applying said amplified radiofrequency signal from across said SQUID ring to the input of a room-temperature radiofrequency amplifier located exteriorly of said superconducting shield.

* * * * *